(12) United States Patent
Vervloet et al.

(10) Patent No.: US 9,156,529 B2
(45) Date of Patent: Oct. 13, 2015

(54) METHOD OF MAKING A LITHOGRAPHIC PRINTING PLATE

(75) Inventors: Ludovicus Hendrik Vervloet, Kessel (BE); Jan Sinnesael, Emblem (BE); Jens Lenaerts, Turnhout (BE)

(73) Assignee: Agfa Graphics NV, Mortsel (BE)

( * ) Notice: Subject to any disclaimer, the term of this patent is extended or adjusted under 35 U.S.C. 154(b) by 0 days.

(21) Appl. No.: 14/342,684

(22) PCT Filed: Aug. 29, 2012

(86) PCT No.: PCT/EP2012/066762
§ 371 (c)(1),
(2), (4) Date: Mar. 4, 2014

(87) PCT Pub. No.: WO2013/034474
PCT Pub. Date: Mar. 14, 2013

(65) Prior Publication Data
US 2014/0272713 A1 Sep. 18, 2014

Related U.S. Application Data

(60) Provisional application No. 61/532,577, filed on Sep. 9, 2011.

(30) Foreign Application Priority Data

Sep. 8, 2011 (EP) .................................... 11180599

(51) Int. Cl.
*G03F 7/00* (2006.01)
*B63B 27/24* (2006.01)
*G03F 7/30* (2006.01)

(52) U.S. Cl.
CPC . *B63B 27/24* (2013.01); *G03F 7/30* (2013.01); *G03F 7/3071* (2013.01); *G03F 7/3092* (2013.01); *Y10T 137/0318* (2015.04); *Y10T 137/6906* (2015.04)

(58) Field of Classification Search
CPC .............. G03F 7/3042; B41C 2210/04; B41C 2210/06; B41C 2210/07; B41C 2210/10; B41C 2210/12
USPC ...................... 430/302; 101/450.1, 453, 463.1
See application file for complete search history.

(56) References Cited

U.S. PATENT DOCUMENTS

| 7,704,679 | B2 | 4/2010 | Van Damme |
| 2006/0153561 | A1 | 7/2006 | Ginther |
| 2008/0232793 | A1* | 9/2008 | Oishi ............................. 396/626 |
| 2008/0254391 | A1* | 10/2008 | Van Damme ................. 430/302 |

FOREIGN PATENT DOCUMENTS

| EP | 1 696 274 A2 | 8/2006 |
| EP | 1696274 A2 * | 8/2006 |
| EP | 1 755 002 A2 | 2/2007 |

OTHER PUBLICATIONS

Official Communication issued in International Patent Application No. PCT/EP2012/066762, mailed on Dec. 17, 2012.

* cited by examiner

*Primary Examiner* — Chanceity Robinson
(74) *Attorney, Agent, or Firm* — Keating & Bennett, LLP (57) ABSTRACT

A method of making a lithographic printing plate including the steps of a) image-wise exposing a lithographic printing plate precursor including a light or heat sensitive coating on a support having a hydrophilic surface or which is provided with a hydrophilic layer, and b) processing the precursor consecutively with a first solution and a second solution thereby removing the coating from the support in the non-printing areas. The first and second solutions are provided by a cascade system such that the second solution overflows into the first solution and the first solution overflows into a container to be further treated as waste, and the second solution is regenerated by adding a replenishing solution or a mixture of replenishing solutions at a rate of at least 5 ml/m$^2$ of treated precursor and at most 30 ml/m$^2$ of treated precursor.

11 Claims, 1 Drawing Sheet

US 9,156,529 B2

METHOD OF MAKING A LITHOGRAPHIC PRINTING PLATE

CROSS-REFERENCE TO RELATED APPLICATIONS

This application is a 371 National Stage Application of PCT/EP2012/066762, filed Aug. 29, 2012. This application claims the benefit of U.S. Provisional Application No. 61/532,577, filed Sep. 9, 2011, which is incorporated by reference herein in its entirety. In addition, this application claims the benefit of European Application No. 11180599.0, filed Sep. 8, 2011, which is also incorporated by reference herein in its entirety.

BACKGROUND OF THE INVENTION

1. Field of the Invention

The present invention relates to a method for making a lithographic printing plate whereby a lithographic printing plate precursor is image-wise exposed and developed in a first and second developing solution, provided in a cascade system.

2. Description of the Related Art

In lithographic printing, a so-called printing master such as a printing plate is mounted on a cylinder of the printing press. The master carries a lithographic image on its surface and a printed copy is obtained by applying ink to the image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called "driographic" printing, the lithographic image consists of ink-accepting and ink-abhesive (ink-repelling) areas and during driographic printing, only ink is supplied to the master.

Printing masters are generally obtained by the so-called computer-to-film (CtF) method, wherein various pre-press steps such as typeface selection, scanning, color separation, screening, trapping, layout and imposition are accomplished digitally and each color selection is transferred to graphic arts film using an image-setter. After processing, the film can be used as a mask for the exposure of an imaging material called plate precursor and after plate processing, a printing plate is obtained which can be used as a master. Since about 1995, the so-called 'computer-to-plate' (CtP) method has gained a lot of interest. This method, also called 'direct-to-plate', bypasses the creation of film because the digital document is transferred directly to a printing plate precursor by a so-called platesetter. A printing plate precursor for CtP is often called a digital plate.

Digital plates can roughly be divided in three categories: (i) silver plates, which work according to the silver salt diffusion transfer mechanism; (ii) photopolymer plates which contain a photopolymerizable composition that hardens upon exposure to light and (iii) thermal plates of which the imaging mechanism is triggered by heat or by light-to-heat conversion. Thermal plates are mainly sensitized for infrared lasers emitting at 830 nm or 1064 nm. Photopolymers can be sensitized for blue, green or red light (i.e. wavelength range between 450 and 750 nm), for violet light (i.e. wavelength range between 350 and 450 nm) or for infrared light (i.e. wavelength range between 750 and 1500 nm). Laser sources have been increasingly used to expose a printing plate precursor which is sensitized to a corresponding laser wavelength. Typically, an Ar laser (488 nm) or a FD-YAG laser (532 nm) can be used for exposing a visible light sensitized photopolymer plate. The wide-scale availability of low cost blue or violet laser diodes, originally developed for data storage by means of DVD, has enabled the production of platesetters operating at shorter wavelength. More specifically, semiconductor lasers emitting from 350 to 450 nm have been realized using an InGaN material. An infrared laser diode emitting around 830 nm or a Nd-YAG laser emitting around 1060 nm can also be used.

After image-wise exposure the printing plate precursors are processed with a developing solution to remove the coating from the support at non-printing area, revealing the underlying hydrophilic surface of the substrate. These non-printing areas are the non-exposed areas for negative-working printing plate precursors and the exposed areas for positive-working printing plate precursors. The coating in the non-exposed areas for negative-working printing plate precursors is not hardened and the coating in the exposed areas for positive-working printing plate precursors has an increased solubility in the developer than in the non-exposed areas. The most common way to remove the coating in the non-printing areas is to contact the image-wise exposed precursor with a developing solution. The developing solution, hereinafter also referred to as developer, can be an aqueous solution or a solvent based solution. Typically, the developer is an aqueous alkaline solution or a gum solution which can be used for developing and gumming the plate simultaneously in one single step.

During processing the developer becomes loaded with components of the coating that have been removed during development and the amount of material in the developer increases as more precursors are developed. Due to the increasing amount of material in the developer the activity of the developer decreases resulting in a changed ability to remove the non-printing areas of the image-wise exposed precursors. This means that, as more precursors are developed, precursors are not developed in the same way, resulting in changed lithographic properties of the printing plates.

It is important for a high-quality printing platemaking system that the lithographic properties are as much as possible at a constant level for each processed plate. This means that also when starting a developing process with fresh developer, the activity of the developer has a constant activity level or reaches a constant activity level after developing a limited number of plates.

SUMMARY OF THE INVENTION

Preferred embodiments of the present invention provide a method for making a lithographic printing plate wherein the developing solution has an improved stability of activity level during processing. This is realised by the method described below, including the specific feature that the image-wise exposed lithographic printing plate precursor is developed with a first developing solution, consecutively with a second developing solution, wherein both solutions are provided in a cascade system and are circulated respectively by a first and second liquid conveying system, wherein the second solution is regenerated by adding a replenishing solution or a mixture of replenishing solutions at a rate of at least 5 ml/m² and at most 30 ml/m², and wherein the first solution, present in the first liquid conveying system, has a volume of at least Vmin and at most Vmax as respectively defined by formula 1 and formula 2.

Since the second solution is regenerated by adding small amounts of regenerator wherein the second solution overflows into the first solution and the first solution further overflows into a container to be treated as waste, the method has an economical advantage of using low amounts of solution for developing and an ecological advantage of generating only small amounts of waste liquid.

Other specific embodiments of the invention are also defined below.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

In accordance with a preferred embodiment of the present invention, there is provided a method of making a lithographic printing plate comprising the steps of a) image-wise exposing a lithographic printing plate precursor, comprising a light or heat sensitive coating on a support having a hydrophilic surface or which is provided with a hydrophilic layer, and b) processing the precursor with a first solution, consecutively with a second solution, thereby removing the coating from the support at non-printing areas, wherein the first and second solutions are provided by a cascade system, wherein the second solution overflows into the first solution and the first solution overflows into a container to be further treated as waste, wherein the second solution is regenerated by adding a replenishing solution or a mixture of replenishing solutions at a rate of at least 5 ml/m² of treated precursor and at most 30 ml/m² of treated precursor, wherein the first and second solutions are circulated respectively by a first and second liquid conveying system, wherein the first solution present in the first liquid conveying system has a volume of at least Vmin and at most Vmax respectively defined by formula 1 and formula 2, $V\text{min}=[A+(\text{processing width}/0.95\text{ m})]\cdot\text{liter}$ (formula 1)

$V\text{max}=[B+(\text{processing width}/0.95\text{ m})]\cdot\text{liter}$ (formula 2)

wherein Vmin and Vmax represent respectively the minimum and maximum volume present in the first liquid conveying system, each of them expressed in liter, wherein A and B represents a constant value of respectively 2 and 15, and wherein the processing width represents the width, expressed in m, inside the processing unit, perpendicular to the processing direction, which is available for processing plate precursors in a uniform way across their width.

Light or Heat Sensitive Coating

In a preferred embodiment of the present invention, the printing plate precursor is image-wise exposed off-press by a platesetter, i.e. a laser exposure apparatus suitable for image-wise exposing a precursor. The precursor used in a preferred embodiment of the method of the present invention can be negative-working or positive-working. In a negative-working precursor the coating is hardened at the exposed areas. Here, "hardened" means that the coating becomes insoluble or non-dispersible for the developing solution.

In a preferred embodiment of the present invention, the coating of a negative-working precursor may comprise heat-sensitive, thermoplastic polymer particles which may form unsoluble coating areas in the exposed areas through coalescence of thermoplastic polymer particles. The thermoplastic particles have an average particle diameter from 10 nm to 200 nm, preferably from 15 to 150 nm, more preferably from 20 to 75 nm, most preferably from 25 nm to 50 nm. The average particle diameter is meant to be the average particle diameter measured by Photon Correlation Spectrometry, also known as Quasi-Elastic or Dynamic Light-Scattering, unless otherwise specified. The measurements were performed according the ISO 13321 procedure (first edition, 1996 Jul. 1) with a Brookhaven BI-90 analyzer, commercially available from Brookhaven Instrument Company, Holtsville, N.Y., USA. The amount of thermoplastic polymer particles is preferably at least 50, more preferably at least 60, most preferably at least 70% by weight relative to the total weight of all the ingredients in the image-recording layer. Preferred thermoplastic polymer particles and their preparation are disclosed in EP 1 914 068 (paragraph [0030] and [0031]) and in WO 2010/031758. The coating may further comprise a hydrophilic binder. Examples of suitable hydrophilic binders are homopolymers and copolymers of vinyl alcohol, (meth)acrylamide, methylol (meth)acrylamide, (meth)acrylic acid, hydroxyethyl (meth)acrylate, maleic anhydride/vinylmethyl-ether copolymers, copolymers of (meth)acrylic acid or vinylalcohol with styrene sulphonic acid. Preferably, the hydrophilic binder comprises polyvinylalcohol or polyacrylic acid. The amount of hydrophilic binder may be between 2 and 30% by weight, preferably between 2 and 20% by weight, more preferably between 3 and 10% by weight relative to the total weight of all ingredients of the image-recording layer. The amount of the hydrophobic thermoplastic polymer particles relative to the amount of the binder is preferably between 8 and 25, more preferably between 10 and 22, most preferably between 12 and 20.

The coating may further contain a dye which absorbs infrared (IR) radiation and converts the absorbed energy into heat. Such dyes are also referred to as infrared dyes or IR dyes. Preferred infrared dyes are cyanine, merocyanine, indoaniline, oxonol, pyrilium and squarilium dyes. Preferred infrared dyes are water compatible, most preferably, water soluble. Cyanine dyes are particularly preferred. Examples of such cyanine dyes are disclosed in EP-A 1 142 707, paragraph [143]. Other preferred infrared dyes are described in EP-A 1 614 541 (page 20 line 25 to page 44 line 29) and EP-As 1 736 312 (paragraphs [0008] to [0021]) and 1 910 082. Particular preferred infrared dyes, resulting in a higher sensitivity, are disclosed in WO 2010/031758. The infrared dye amount is preferably at least 6% by weight, more preferably at least 8% by weight, relative to the total weight of the ingredients of the image recording layer. As described in EP-A 1 859 936 the amount of infrared dye may be adjusted to the particle size of the thermoplastic particles.

In positive-working precursors the coating is oleophilic and is not readily soluble in the developer at the non-exposed areas and becomes soluble in the developer at the exposed areas. Typically, the oleophilic resin in these positive-working, heat-sensitive precursors is a phenolic resin such as novolac, resol or a polyvinylphenolic resin. The phenolic resin can be chemically modified whereby the phenolic monomeric unit is substituted by a group such as described in WO 99/01795, EP 934 822, EP 1 072 432, U.S. Pat. No. 3,929,488, EP 2 102 443, EP 2 102 444, EP 2 102 445, EP 2 102 446. The phenolic resin can also be mixed with other polymers as described in WO 2004/020484, U.S. Pat. No. 6,143,464, WO 2001/09682, EP 933 682, WO99/63407, WO2002/53626, EP 1 433 594 and EP 1 439 058. The coating can also be composed of two or more layers, each of them comprising one or more of the above described resins as described in e.g. EP 864 420, EP 909 657, EP-A 1 011 970, EP-A 1 263 590, EP-A 1 268 660, EP-A 1 072 432, EP-A 1 120 246, EP-A 1 303 399, EP-A 1 311 394, EP-A 1 211 065, EP-A 1 368 413, EP-A 1 241 003, EP-A 1 299 238, EP-A 1 262 318, EP-A 1 275 498, EP-A 1 291 172, WO 2003/74287, WO 2004/33206, EP-A 1 433 594 and EP-A 1 439 058. The heat-sensitive coating also contain one or more dissolution inhibitors. Dissolution inhibitors are compounds which reduce the dissolution rate of the hydrophobic polymer in the aqueous alkaline developer at the non-exposed areas of the coating and wherein this reduction of the dissolution rate is destroyed by the heat generated during the exposure so that the coating readily dissolves in the developer in the exposed areas. The dissolution rate of the non-exposed coating in the developer is preferably reduced by interaction between the hydrophobic polymer and the inhibitor, due to e.g. hydrogen bonding between these compounds. Suitable dissolution inhibitors are preferably organic compounds which comprise at least one aromatic group and a hydrogen bonding site, e.g. a carbonyl group, a sulfonyl group, or a nitrogen atom which may be quaternized and which may be part of a heterocyclic ring or which may be part of an amino substituent of the organic compound. Suitable dissolution inhibitors of this type have been disclosed in e.g. EP-A 825 927 and 823 327. Water-repellent polymers represent another type of suitable dissolution inhibitors. Such polymers seem to increase the developer resistance of the coating by repelling the aqueous developer from the coating. The water-repellent polymers forms a barrier layer which shields the coating from the developer and the solubility of the barrier layer in the developer or the penetrability of the barrier layer by the developer can be increased by exposure to heat or infrared light, as described in e.g. EP-A 864420, EP-A 950 517 and WO99/21725. Preferred examples of the water-repellent polymers are polymers comprising siloxane and/or perfluoroalkyl units. Preferably, also one or more development accelerators are included in the heat-sensitive coating, i.e. compounds which act as dissolution promoters because they are capable of increasing the dissolution rate of the non-exposed coating in the developer. The simultaneous application of dissolution inhibitors and accelerators allows a precise fine tuning of the dissolution behavior of the coating. Suitable dissolution accelerators are cyclic acid anhydrides, phenols or organic acids.

The coating may be applied on the support by any coating technique known in the art. After applying the coating, the applied layer(s) are dried as commonly known in the art.

Support

A particularly preferred lithographic support is an electro-chemically grained and anodized aluminum support. Graining an anodizing of aluminum supports is well known. The acid used for graining can be e.g. nitric acid or sulfuric acid. The acid used for graining preferably comprises hydrogen chloride. Also mixtures of e.g. hydrogen chloride and acetic acid can be used. The relation between electrochemical graining and anodizing parameters such as electrode voltage, nature and concentration of the acid electrolyte or power consumption on the one hand and the obtained lithographic quality in terms of Ra and anodic weight (g/m$^2$ of $Al_2O_3$ formed on the aluminum surface) on the other hand is well known. More details about the relation between various production parameters and Ra or anodic weight can be found in e.g. the article "Management of Change in the Aluminium Printing Industry" by F. R. Mayers, published in the ATB Metallurgie Journal, volume 42 nr. 1-2 (2002) pag. 69.

The anodized aluminum support may be subject to a so-called post-anodic treatment to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde.

Another useful post-anodic treatment may be carried out with a solution of polyacrylic acid or a polymer comprising at least 30 mol % of acrylic acid monomeric units, e.g. GLASCOL E15, a polyacrylic acid, commercially available from ALLIED COLLOIDS.

The grained and anodized aluminum support may be a sheet-like material such as a plate or it may be a cylindrical element such as a sleeve which can be slid around a print cylinder of a printing press.

The support can also be a flexible support, which may be provided with a hydrophilic layer, hereinafter called 'base layer'. The flexible support is e.g. paper, plastic film or aluminum. Preferred examples of plastic film are polyethylene terephthalate film, polyethylene naphthalate film, cellulose acetate film, polystyrene film, polycarbonate film, etc. The plastic film support may be opaque or transparent. The base layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic base layer may vary in the range of 0.2 to 25 µm and is preferably 1 to 10 µm. More details of preferred embodiments of the base layer can be found in e.g. EP-A 1 025 992.

Exposure

The image-wise exposing step is carried out off-press in a platesetter, i.e. an exposure apparatus suitable for image-wise exposing the precursor by a laser such as a laser diode, emitting around 830 nm, a NdYAG laser, emitting around 1060 nm, a violet laser, emitting around 400 nm, or a gas laser such as an Ar laser, or by a digitally modulated UV-exposure, e.g. by digital mirror devices, or by a conventional exposure in contact with a mask. Lasers emitting near infrared radiation having a wavelength in the range from about 700 to about 1500 nm are e.g. a semiconductor laser diode, a Nd:YAG or a Nd:YLF laser, are used. A lithographic image can be obtained upon image-wise exposure of the printing plate precursor with infrared radiation having an energy density, measured at the surface of the precursor, of 250 mJ/cm$^2$ or less, more preferably of 200 mJ/cm$^2$ or less, most preferably of 180 mJ/cm$^2$ or less. With a useful lithographic image on the printing plate 2% dots (at 200 lpi) are perfectly visible on at least 1 000 prints on paper.

Processing

Subsequently to the imaging step, the plate precursor is treated, i.e. developed wherein a developing solution is applied to the coating of the precursor whereby the soluble coating areas are removed from the support revealing the hydrophilic surface of the support.

The developing solution can be an aqueous solution or a solvent based solution. Typically, an aqueous alkaline solution can be used in the processing of lithographic printing plate precursors.

The term aqueous includes water or mixtures of water with water-miscible organic solvents such as alcohols, e.g. methanol, ethanol, 2-propanol, butanol, iso-amyl alcohol, octanol, cetyl alcohol, etc.; glycols, e.g. ethylene glycol; glycerine; N-methylpyrrolidone; methoxypropanol; and ketones, e.g. 2-ptopanone and 2-butanone; etc. The water-miscible organic solvent may be present in these mixtures of at most 50% by weight, preferably less than 20% by weight, more preferably less than 10% by weight, most preferably no organic solvent is present in the aqueous solution. The aqueous solution may further comprise a compound solubilized or dispersed in water or a mixture of water and a water-miscible solvent. Such compounds may be selected from the compounds of the gum solution as described below.

Currently, most commercial lithographic plates require an additional gumming process after the exposed plate is developed and before it is put on the press, in order to protect the plate from contamination, e.g. by oxidation, fingerprints, fats, oil or dust, or from damaging, e.g. by scratches during handling of the plate.

In a specific embodiment of the present invention, lithographic printing plate precursors such as negative-working plate precursors can also be processed with a gum solution only. The development with a gum solution has the additional benefit that, due to the remaining gum on the plate in the non-exposed areas, an additional gumming step is not required to protect the surface of the support in the non-printing areas. As a result, the precursor is processed and gummed in one single step and the obtained lithographic image on the plate will not be affected by ambient daylight or by contamination. In a preferred embodiment of the present invention, negative-working thermal plates comprising thermoplastic polymer particles are processed with a gum solution only. In the printing step, the plate is mounted on the plate cylinder of the printing press and the printing process is started.

The Gum Solution

A gum solution is typically an aqueous liquid which comprises one or more surface protective compounds that are capable of protecting the lithographic image of a printing plate against contamination, e.g. by oxidation, fingerprints, fats, oils or dust, or damaging, e.g. by scratches during handling of the plate. Suitable examples of such compounds are film-forming hydrophilic polymers or surfactants. The layer that remains on the plate after treatment with the gum solution preferably comprises between 0.005 and 20 g/m$^2$ of the surface protective compound, more preferably between 0.010 and 10 g/m$^2$, most preferably between 0.020 and 5 g/m$^2$.

In the present description, all concentrations of compounds present in the gum solution are expressed as percentage by weight (wt. % or % w/w) relative to the ready-to-use gum solution, unless otherwise indicated. A gum solution may be normally supplied as a concentrated solution which is diluted by the end user with water to a ready-to-use gum solution before use according to the instructions of the supplier, usually 1 part of the gum is diluted with 1 part to 10 parts of water.

Preferred polymers for use as protective compound in the gum solution are gum arabic, pullulan, cellulose derivatives such as carboxymethylcellulose, carboxyethylcellulose or methylcellulose, (cyclo)dextrin, poly(vinyl alcohol), poly(vinyl pyrrolidone), polysaccharide, homo- and copolymers of acrylic acid, methacrylic acid or acrylamide, a copolymer of vinyl methyl ether and maleic anhydride, a copolymer of vinyl acetate and maleic anhydride or a copolymer of styrene and maleic anhydride. Highly preferred polymers are homo- or copolymers of monomers containing carboxylic, sulfonic or phosphonic groups or the salts thereof, e.g. (meth)acrylic acid, vinyl acetate, styrene sulfonic acid, vinyl sulfonic acid, vinyl phosphonic acid or acrylamidopropane sulfonic acid.

Examples of surfactants for use as surface protective agent include anionic or nonionic surfactants. The gum solution may also comprise one or more of the above hydrophilic polymers as surface protective agent and, in addition, one or more surfactants to improve the surface properties of the coated layer. The surface tension of the gum solution is preferably from 20 to 50 mN/m.

The gum solution comprises preferably an anionic surfactant, more preferably an anionic surfactant whereof the anionic group is a sulphonic acid group.

Examples of the anionic surfactant include aliphates, abietates, hydroxyalkanesulfonates, alkanesulfonates, dialkylsulfosuccinates, straight-chain alkylbenzenesulfonates, branched alkylbenzenesulfonates, alkylnaphthalenesulfonates, alkylphenoxypolyoxyethylenepropylsulfonates, salts of polyoxyethylene alkylsulfophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphatic alkylesters, salts of alkylsulfuric esters, sulfuric esters of polyoxyethylenealkylethers, salts of sulfuric esters of aliphatic monoglycerides, salts of sulfuric esters of polyoxyethylenealkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrenemaleic anhydride copolymers, partially saponified compounds of olefin-maleic anhydride copolymers, and naphthalenesulfonateformalin condensates. Particularly preferred among these anionic surfactants are dialkylsulfosuccinates, salts of alkylsulfuric esters and alkylnaphthalenesulfonates.

Specific examples of suitable anionic surfactants include sodium dodecylphenoxybenzene disulfonate, the sodium salt of alkylated naphthalenesulfonate, disodium methylene-di-naphthalene-disulfonate, sodium dodecyl-benzenesulfonate, sulfonated alkyl-diphenyloxide, ammonium or potassium perfluoroalkylsulfonate and sodium dioctyl-sulfosuccinate.

Suitable examples of the nonionic surfactants include polyoxyethylene alkyl ethers, polyoxyethylene alkyl aryl ethers wherein the aryl group may be a phenyl group, a naphthyl group or an aromatic heterocyclic group, polyoxyethylene polystyryl phenyl ethers, polyoxyethylene polyoxypropylene alkyl ethers, polyoxyethylene polyoxypropylene block polymers, partial esters of glycerinaliphatic acids, partial esters of sorbitanaliphatic acid, partial esters of pentaerythritolaliphatic acid, propyleneglycolmonoaliphatic esters, partial esters of sucrosealiphatic acids, partial esters of polyoxyethylenesorbitanaliphatic acid, partial esters of polyoxyethylenesorbitolaliphatic acids, polyethyleneglycolaliphatic esters, partial esters of poly-glycerinaliphatic acids, polyoxyethylenated castor oils, partial esters of polyoxyethyleneglycerinaliphatic acids, aliphatic diethanolamides, N,N-bis-2-hydroxyalkylamines, polyoxyethylene alkylamines, triethanolaminealiphatic esters, and trialkylamine oxides. Particularly preferred among these nonionic surfactants are polyoxyethylene alkylphenyl ethers, polyoxyethylene alkylnaphthyl ethers and poloxyethylene-polyoxypropylene block polymers. Further, fluorinic and siliconic anionic and nonionic surfactants may be similarly used.

Two or more of the above surfactants may be used in combination. For example, a combination of two or more different anionic surfactants or a combination of an anionic surfactant and a nonionic surfactant may be preferred. The amount of such a surfactant is not specifically limited but is preferably from 0.01 to 30 wt. %, more preferably from 0.05 to 20 wt. %.

According to a preferred embodiment of the present invention the gum solution has a pH-value preferably between 3 and 9, more preferably between 4.5 and 8.5, most preferably between 5 and 7. The pH of the gum solution is usually adjusted with a mineral acid, an organic acid or an inorganic salt in an amount of from 0.01 to 15 wt. %, preferably from 0.02 to 10 wt. %. Examples of the mineral acids include nitric acid, sulfuric acid, phosphoric acid and metaphosphoric acid. Especially organic acids are used as pH control agents and as desensitizing agents. Examples of the organic acids include carboxylic acids, sulfonic acids, phosphonic acids or salts thereof, e.g. succinates, phosphates, phosphonates, sulfates and sulfonates. Specific examples of the organic acid include citric acid, acetic acid, oxalic acid, malonic acid, p-toluenesulfonic acid, tartaric acid, malic acid, lactic acid, levulinic acid, phytic acid and organic phosphonic acid.

The gum solution further comprises preferably an inorganic salt. Examples of the inorganic salt include magnesium nitrate, monobasic sodium phosphate, dibasic sodium phosphate, nickel sulfate, sodium hexametaphosphate and sodium tripolyphosphate. An alkali-metal dihydrogen phosphate such as $KH_2PO_4$ or $NaH_2PO_4$ is most preferred. Other inorganic salts can be used as corrosion inhibiting agents, e.g. magnesium sulfate or zinc nitrate. The mineral acid, organic acid or inorganic salt may be used singly or in combination with one or more thereof.

In accordance with another embodiment of the present invention, the gum solution as developer in the processing of the plate precursor comprises preferably a mixture of an anionic surfactant and an inorganic salt. In this mixture the anionic surfactant is preferably an anionic surfactant with a sulphonic acid group, more preferably an alkali-metal salt of a mono- or di-alkyl substituted diphenylether-sulphonic acid, and the inorganic salt is preferably a mono or dibasic phosphate salt, more preferably an alkali-metal dihydrogen phosphate, most preferably $KH_2PO_4$ or $NaH_2PO_4$.

In accordance with another embodiment of the present invention, the gum solution comprising a mixture of an anionic surfactant and an inorganic salt has preferably a pH-value between 3 and 9, more preferably between 4 and 8, most preferably between 5 and 7.

Besides the foregoing components, a wetting agent such as ethylene glycol, propylene glycol, triethylene glycol, tripropylene glycol, butylene glycol, hexylene glycol, diethylene glycol, dipropylene glycol, glycerin, trimethylol propane and diglycerin may also be present in the gum solution. The wetting agent may be used singly or in combination with one or more thereof. In general, the foregoing wetting agent is preferably used in an amount of from 1 to 25 wt. %.

Further, a chelate compound may be present in the gum solution. Calcium ion and other impurities contained in the diluting water can have adverse effects on printing and thus cause the contamination of printed matter. This problem can be eliminated by adding a chelate compound to the diluting water. Preferred examples of such a chelate compound include organic phosphonic acids or phosphonoalkanetricarboxylic acids. Specific examples are potassium or sodium salts of ethylenediaminetetraacetic acid, diethylenetriamine-pentaacetic acid, triethylenetetraminehexaacetic acid, hydroxyethylethylenediaminetriacetic acid, nitrilotriacetic acid, 1-hydroxyethane-1,1-diphosphonic acid and aminotri (methylenephosphonic acid). Besides these sodium or potassium salts of these chelating agents, organic amine salts are useful. The preferred amount of such a chelating agent to be added is from 0.001 to 5 wt. % relative to the gum solution in diluted form.

Further, an antiseptic and an anti-foaming agent may be present in the gum solution. Examples of such an antiseptic include phenol, derivatives thereof, formalin, imidazole derivatives, sodium dehydroacetate, 4-isothiazoline-3-one derivatives, benzoisothiazoline-3-one, benztriazole derivatives, amidineguanidine derivatives, quaternary ammonium salts, pyridine derivatives, quinoline derivatives, guanidine derivatives, diazine, triazole derivatives, oxazole and oxazine derivatives. The preferred amount of such an antiseptic to be added is such that it can exert a stable effect on bacteria, fungi, yeast or the like. Though depending on the kind of bacteria, fungi and yeast, it is preferably from 0.01 to 4 wt. % relative to the gum solution in diluted form. Further, preferably, two or more antiseptics may be used in combination to exert an aseptic effect on various fungi and bacteria. The anti-foaming agent is preferably a silicone anti-foaming agent. Among these anti-foaming agents, either an emulsion dispersion type or solubilized type anti-foaming agent may be used. The proper amount of such an anti-foaming agent to be added is from 0.001 to 1.0 wt. % relative to the gum solution in diluted form.

Besides the foregoing components, an ink receptivity agent may be present in the gum solution if desired. Examples of such an ink receptivity agent include turpentine oil, xylene, toluene, low heptane, solvent naphtha, kerosine, mineral spirit, hydrocarbons such as petroleum fraction having a boiling point of about 120° C. to about 250° C., diester phthalates (e.g., dibutyl phthalate, diheptyl phthalate, di-n-octyl phthalate, di(2-ethylhexyl)phthalate, dinonyl phthalate, didecyl phthalate, dilauryl phthalate, butylbenzyl phthalate), aliphatic dibasic esters (e.g., dioctyl adipate, butylglycol adipate, dioctyl azelate, dibutyl sebacate, di(2-ethylhexyl)sebacate dioctyl sebacate), epoxidated triglycerides (e.g., epoxy soyabean oil), ester phosphates (e.g., tricresyl phosphate, trioctyl phosphate, trischloroethyl phosphate) and plasticizers having a solidification point of 15° C. or less and a boiling point of 300° C. or more at one atmospheric pressure such as esters of benzoates (e.g., benzyl benzoate). Examples of other solvents which can be used in combination with these solvents include ketones (e.g., cyclohexanone), halogenated hydrocarbons (e.g., ethylene dichloride), ethylene glycol ethers (e.g., ethylene glycol monomethyl ether, ethylene glycol monophenyl ether, ethylene glycol monobutyl ether), aliphatic acids (e.g., caproic acid, enathic acid, caprylic acid, pelargonic acid, capric acid, undecylic acid, lauric acid, tridecylic acid, myristic acid, pentadecylic acid, palmitic acid, heptadecylic acid, stearic acid, nonadecanic acid, arachic acid, behenic acid, lignoceric acid, cerotic acid, heptacosanoic acid, montanic acid, melissic acid, lacceric acid, isovaleric acid) and unsaturated aliphatic acids (e.g., acrylic acid, crotonic acid, isocrotonic acid, undecyclic acid, oleic acid, elaidic acid, cetoleic acid, erucic acid, butecidic acid, sorbic acid, linoleic acid, linolenic acid, arachidonic acid, propiolic acid, stearolic acid, clupanodonic acid, tariric acid, licanic acid). Preferably, it is an aliphatic acid which is liquid at a temperature of 50° C., more preferably has from 5 to 25 carbon atoms, most preferably has from 8 to 21 carbon atoms. The ink receptivity agent may be used singly or in combination with one or more thereof. The ink receptivity agent is preferably used in an amount of from 0.01 to 10 wt. %, more preferably from 0.05 to 5 wt. %. The foregoing ink receptivity agent may be present as an oil-in-water emulsion or may be solubilized with the aid of a solubilizing agent.

The viscosity of the gum solution can be adjusted to a value of e.g. between 1.7 and 5 mPa·s, by adding viscosity increasing compounds, such as poly(ethylene oxide) or polyvinylalcohol, e.g. having a molecular weight between $10^4$ and $10^7$. Such compounds can be present in a concentration of 0.01 to 10 g/l.

A baking gum has a similar composition as described above, with the additional preference towards compounds that do not evaporate at the usual bake temperatures. Baking gum solutions or baking gumming solutions can be aqueous solutions of sodium dodecyl phenoxy benzene disulphonate, alkylated naphthalene sulphonic acid, sulphonated alkyl diphenyl oxide, methylene dinaphtalene sulphonic acid, etc. Other gumming solutions contain a hydrophilic polymer component and an organic acid component. Still other baking gumming solutions contains the potassium salt of the hydroxyethylidene diphosphonic acid. Still other baking gumming solutions contain a sulphosuccinamate compound and phosphoric acid.

The contact angle between the baking gum solution and the plate is preferably lowered by adding at least one surfactant. Preferred surfactants are non-ionic polyglycols and perfluorated aliphatic polyester acrylates.

In another embodiment the baking gumming solutions comprises (a) water, (b) at least one hydrophilic polymer and (c) at least one component selected from the group consisting of water soluble organic acids comprising at least two acid functions and being selected form the group consisting of a benzene carboxylic acid, a benzene sulphonic acid, a benzene phosphonic acid, an alkane phosphonic acid and water soluble salts thereof. The mentioned compounds (b) and (c) which are dissolved in the aqueous solution in accordance with a preferred embodiment of the present invention are such that they do not evaporate at the customary baking temperatures. The protective layer which is formed remains water-soluble, even after baking, and can be readily removed without damaging the printing plate. Component (b) comprises in particular the following hydrophilic polymers: N-polyvinylpyrrolidone, polyvinylmethylether, copolymers containing ethylene units and maleic anhydride units, homopolymers or copolymers containing vinyl phosphonic acid units, vinyl methyl phosphinic acid units and/or acrylic acid units and/or a polyalkylene glycol, such as polyethylene glycol. Component (c) comprises in particular: benzene disulphonic acids, benzene polycarboxylic acids having from 3 to 6 carboxyl groups, alkane diphosphonic acids which having from 1 to 3 carbon atoms in the alkane group, carboxyl group containing alkane diphosphonic acids which have from 5 to 9 carbon atoms in the alkane group, and/or one of the water-soluble salts of these acids (preferably alkali metal salts or ammonium salts). Specific examples of component (c) include benzene-1,3-disulphonic acid, benzene-1,2,4-tricarboxylic acid (trimellitic acid), benzene 1,2,4,5-tetracarboxylic acid (pyromellitic acid), benzene hexacarboxylic acid (mellitic acid), methane diphosphonic acid (diphosphono methane), 4,4-diphosphono-heptane-1,7-dioic acid (3,3-diphosphone-pimeic acid), and the sodium salts of these acids. In other embodiments the baking gumming solution for use can additionally contain hydroxy-polycarboxylic acids, such as citric acid and/or the salts thereof, water soluble alkanediols having at least 4 carbon atoms, such as hexanediol-(1,6) and surfactants (preferably anionic or non-ionic surfactants) such as alkyl aryl sulphonates, alkyl phenol ether sulphonates and a natural surfactant (e.g. Saponin). Specific examples of suitable baking gum solutions, ingredients and concentrations thereof, can be found in e.g. EP-A 222 297, EP-A 1 025 992, DE-A 2 626 473 and U.S. Pat. No. 4,786,581.

Processing Method

In accordance with a preferred embodiment of the present invention, the image-wise exposed precursor is developed with a first solution, consecutively with a second solution, thereby removing the coating from the support at the non-printing areas. These two solutions are provided by a cascade system, wherein the second solution overflows into the first solution and the first solution overflows into a container to be further treated as waste.

The first and second solutions are circulated respectively by a first and second liquid conveying system. Each of these liquid conveying systems comprises a bath, a pump and a set of pipes to circulate the solution. Each of these solutions is brought into contact with the image-wise exposed precursor by a spraying, jetting, dipping or coating technique, including spin coating, roll coating, slot coating or gravure coating, in an automatic apparatus. The spraying, jetting, dipping or coating techniques are preferred, spraying or jetting are more preferred.

During the processing, the coating of the precursor is preferably rubbed and/or brushed with at least one roller while applying each of the first and second solution to the coating. Each of the first and second solution is provided with a bath wherein the solution is present and wherein the solution which is applied on the precursor can be collected and conducted to the pump for circulation and to be used several times to develop the precursor.

The first and second solutions used in the developing step have preferably a temperature ranging between 15° C. and 85° C., more preferably between 18° C. and 65° C., most preferably between 20° C. and 55° C.

In accordance with a preferred embodiment of the present invention, the first solution present in the first liquid conveying system has a volume of at least Vmin and at most Vmax respectively defined by formula 1 and formula 2, $$V\text{min}=[A+(\text{processing width}/0.95 \text{ m})]\cdot\text{liter} \quad \text{(formula 1)}$$

$$V\text{max}=[B+(\text{processing width}/0.95 \text{ m})]\cdot\text{liter} \quad \text{(formula 2)}$$

wherein Vmin and Vmax represent respectively the minimum and maximum volume present in the first liquid conveying system, each of them expressed in liter, wherein A and B represents a constant value of respectively 2 and 15, and wherein the processing width represents the width, expressed in m, inside the processing unit, perpendicular to the processing direction, which is available for processing plate precursors in a uniform way across their width. In a preferred embodiment of the present invention, the value of B is 10, more preferably 8, most preferably 6.

In accordance with a preferred embodiment of the present invention, the second solution is regenerated by adding a replenishing solution or a mixture of replenishing solutions. It is important that the amount of added replenishing solution, added to the second solution has to be small in order to limit the amount of waste developer, produced during processing. Therefore, the rate of replenishing is at least 5 ml of the total amount of replenishing solution or replenishing solutions per $m^2$ of treated precursor and at most 30 ml of the total amount of replenishing solution or replenishing solutions per $m^2$ of treated precursor, preferably at least 10 ml/$m^2$ and at most 25 ml/$m^2$, more preferably at least 15 ml/$m^2$ and at most 20 ml/$m^2$.

In a preferred embodiment of the present invention, the second solution is regenerated by a replenishing solution having the same composition as the starting second solution. In another embodiment of the present invention, the second solution is regenerated by a replenishing solution having a composition with a higher concentration of the active components as present in the starting second solution. In another embodiment, the second solution is regenerated by a mixture of replenishing solutions. Such a mixture of replenishing solutions may comprise at least one solution wherein only one or two or three active components of the starting second solution composition is (are) present, optionally in a different concentration than present in the starting second solution, the other solution or solutions of the mixture may comprise another active component or components than present in the first replenishing solution, optionally in a different concentration than present in the starting second solution. When a mixture of replenishing solutions is used, one of the replenishing solutions may be water.

The addition of replenishing solution, i.e. the type and the amount of replenishing solution, may be regulated by the measurement of at least one of the following parameters such as the number and area of plate precursor developed, the time period of developing, the volume in each developing bath (minimum and maximum level), the viscosity (or viscosity increase) of the solution, the pH (or pH change) of the solution, the density (or density increase) of the solution and the conductivity (or conductivity increase) of the solution, or a combination of at least two of them, preferably area of plate precursor developed. The density (or density increase) of the solution can be measured with a PAAR densitymeter. When the addition of replenishing solution is regulated by measurement of a parameter, the replenisher can be added continuously or in batch form when a predetermined threshold value of the parameter is reached or is crossed. The size of the added batch at each time depends on the predetermined threshold value. In an embodiment of the present invention, this measured parameter is the number of square meters of precursor processed and a predetermined amount of replenisher is added in batch form each time after processing of a fixed area of precursor. This fixed area of processed precursor is a value preferably ranging between 0.5 and 20 $m^2$ of processed precursor, more preferably between 0.8 and 10 $m^2$ of processed precursor, most preferably between 1 and 5 $m^2$ of processed precursor.

The precursor is firstly developed with the first solution and then consecutively with the second solution. Hereby, the most of the soluble coating parts of the precursor are removed with the first solution and the removed material accumulates in the first solution, resulting in a change in developing activity of the solution. Due to the addition of replenishing solution into the second solution and due to the overflow of second solution, in cascade with the first solution, the concentration of removed material in the first solution reaches a constant level. It is important that, when starting with a fresh developing solution, the number of plates to be processed in order to obtain this constant level of concentration of removed material is as small as possible, because a change in developing activity may result in different lithographic properties. Therefore, the volume of the first solution present in the first liquid conveying system has to be as small as possible. In accordance with a preferred embodiment of the present invention, this volume is at least Vmin and at most Vmax as respectively defined by formula 1 and formula 2, $$V\text{min} = [A + (\text{processing width}/0.95 \text{ m})] \cdot \text{liter} \quad \text{(formula 1)}$$

$$V\text{max} = [B + (\text{processing width}/0.95 \text{ m})] \cdot \text{liter} \quad \text{(formula 2)}$$

wherein Vmin and Vmax represent respectively the minimum and maximum volume present in the first liquid conveying system, each of them expressed in liter, wherein A and B represents a constant value of respectively 2 and 15, preferably respectively 2 and 10, more preferably respectively 2 and 8, most preferably respectively 2 and 6, and wherein the processing width represents the width, expressed in m, inside the processing unit, perpendicular to the processing direction, which is available for processing plate precursors in a uniform way across their width.

In another embodiment of the present invention, the volume of the second solution present in the second liquid conveying system has a volume of at least Vmin and at most Vmax respectively defined by formula 3 and formula 4, $$V\text{min} = [A' + (\text{processing width}/0.95 \text{ m})] \cdot \text{liter} \quad \text{(formula 3)}$$

$$V\text{max} = [B' + (\text{processing width}/0.95 \text{ m})] \cdot \text{liter} \quad \text{(formula 4)}$$

wherein Vmin and Vmax represent respectively the minimum and maximum volume present in the second liquid conveying system, each of them expressed in liter, wherein A' and B' represents a constant value of respectively 2 and 15, preferably respectively 2 and 10, more preferably respectively 2 and 8, most preferably respectively 2 and 6, and wherein the processing width represents the width, expressed in m, inside the processing unit, perpendicular to the processing direction, which is available for processing plate precursors in a uniform way across their width. In another preferred embodiment of the present invention, the volume of the second solution present in the second liquid conveying system is the same as the volume of the first solution present in the first liquid conveying system.

The first solution may be regenerated by adding a replenishing solution or a mixture of replenishing solutions. It is important that the amount of added replenishing solution, added to the first solution has to be small in order to limit the amount of waste developer, produced during processing. Therefore, the rate of replenishing is at least 5 ml of the total amount of replenishing solution or replenishing solutions per $m^2$ of treated precursor and at most 30 ml of the total amount of replenishing solution or replenishing solutions per $m^2$ of treated precursor, preferably at least 10 ml/$m^2$ and at most 25 ml/$m^2$, more preferably at least 15 ml/$m^2$ and at most 20 ml/$m^2$. In another embodiment of the present invention, the first solution is regenerated by a replenishing solution having the same composition as the starting first solution or having a composition with a higher concentration of the active components as present in the starting first solution. In another embodiment, the first solution is regenerated by a mixture of replenishing solutions. Such a mixture of replenishing solutions may comprise at least one solution wherein only one or two or three active components of the starting first solution composition is (are) present, optionally in a different concentration than present in the starting first solution, the other solution or solutions of the mixture may comprise another active component or components than present in the first replenishing solution, optionally in a different concentration than present in the starting first solution. When a mixture of replenishing solutions is used, one of the replenishing solutions may be water. In a more preferred embodiment, the first solution is regenerated by adding water.

In accordance with a highly preferred embodiment, a lithographic printing plate is made by the method as defined above wherein the lithographic printing plate precursor is a negative-working plate comprising thermoplastic polymer particles, and wherein the first and second solutions are a gum solution whereby the plate is developed and gummed in a single step, and wherein the second solution is regenerated with a gum solution having the same composition as the starting gum solution of the first and second solution, optionally wherein the first solution is regenerated with water.

Drying

According to another embodiment of the present invention, the plate can be dried after the processing step in a drying unit. In a preferred embodiment the plate is dried by heating the plate in the drying unit which may contain at least one heating element selected from an IR-lamp, an UV-lamp, a heated metal roller or heated air. In a preferred embodiment of the present invention, the plate is dried with heated air as known in the drying section of a classical developing machine.

Baking

According to another embodiment of the present invention, the plate can be heated in a baking unit, optionally after drying the plate. In a preferred embodiment of the present invention, when the plate is heated in a baking unit, the precursor is developed by using a baking gum and the gum solution is preferably replenished by adding a replenishing baking gum. The replenishing baking gum is a solution which may be selected from a starting baking gum, i.e. a solution having the same composition as the baking gum used at the start of the development, a concentrated baking gum or a diluted baking gum, i.e. a solution having a higher respectively lower concentration of additives than the starting baking gum, and water.

The baking unit may contain at least one heating element selected from an IR-lamp, an UV-lamp, a heated metal roller or heated air. The plate is preferably heated in the baking unit at a temperature above 110° C. and less than the decomposition temperature of the coating, more preferably between 200° C. and 295° C., most preferably between 250° C. and 290° C. A longer heating time is usually used when a lower heating temperature is used, and a shorter heating time is used when a higher heating temperature is used. The plate is preferably heated over a time period of less than 10 minutes, more preferably less than 5 minutes, most preferably less than 2 minutes.

In a preferred embodiment of the present invention, the plate, containing in its image recording layer hydrophobic thermoplastic polymer particles as defined in EP-A 1 767 349, is heated by the method as described in EP-A 1 767 349.

In a preferred embodiment of the present invention, the plate is heated by the method as described in EP-A 1 506 854. In another preferred embodiment of the present invention, the plate is heated by the method as described in WO 2005/015318.

In another embodiment of the present invention, the drying step and the heating step may be combined in one single step wherein the plate, after the developing step, is dried and heated in an integrated drying-baking station.

Single Apparatus

According to another embodiment of the present invention, the first developing bath and the second developing bath are coupled together by a mechanical plate conveyor. The second developing bath may be further coupled by a mechanical plate conveyor to the drying unit. Optionally, when the plates are gummed before drying, the second developing bath may be coupled by a mechanical plate conveyor to a rinsing unit if present and further to a gumming unit; the gumming unit is then further coupled to the drying unit. The drying unit may be further coupled by a mechanical plate conveyor to the baking unit. The second developing bath or a gumming unit, if present, may also be further coupled by a mechanical plate conveyor to the integrated drying-baking unit.

According to still another preferred embodiment of the present invention, the first developing bath may be further coupled to the platesetter by a mechanical plate conveyor wherein the precursor is shielded from ambient light.

EXAMPLES

Preparation of the Aluminum Substrate AS-01

A 0.3 mm thick aluminum foil was degreased by spraying with an aqueous solution containing 34 g/l NaOH at 70° C. for 6 seconds and rinsed with demineralised water for 3.6 seconds. The foil was then electrochemically grained during 8 seconds using an alternating current in an aqueous solution containing 15 g/l HCl, 15 g/l $SO_4^{2-}$ ions and 5 g/l $Al^{3+}$ ions at a temperature of 37° C. and a current density of about 100 $A/dm^2$ (charge density of about 800 $C/dm^2$). Afterwards, the aluminum foil was desmutted by etching with an aqueous solution containing 145 g/l of sulphuric acid at 80° C. for 5 seconds and rinsed with demineralised water for 4 seconds. The foil was subsequently subjected to anodic oxidation during 10 seconds in an aqueous solution containing 145 g/l of sulphuric acid at a temperature of 57° C. and a current density of 33 $A/dm^2$ (charge density of 330 $C/dm^2$), then washed with demineralised water for 7 seconds and post-treated for 4 seconds (by spray) with a solution containing 2.2 g/l PVPA at 70° C., rinsed with demineralised water for 3.5 seconds and dried at 120° C. for 7 seconds.

The support thus obtained is characterised by a surface roughness Ra of 0.35-0.4 µm (measured with interferometer NT1100) and an anodic weight of about 4.0 $g/m^2$.

Preparation Thermoplastic Particles LX-01

The polymer emulsion was prepared by a seeded emulsion polymerisation using styrene and acrylonitrile as monomers. All surfactant (4.5% towards the total monomer amount) was present in the reactor before any monomer was added. In a double-jacketed reactor of 2 liter, 10.35 g of Chemfac PB-133, 1.65 g of $NaHCO_3$ and 1482.1 g of demineralised water was added. The reactor was flushed with nitrogen and heated until 75° C. When the reactor content reached a temperature of 75° C., 1.5% of the monomers were added (i.e. a mixture of 2.29 g styrene and 1.16 g acrylonitrile). The monomers were emulsified during 15 minutes at 75° C. followed by the addition of 37.95 gram of a 2% solution of sodium persulfate in water. The reactor was subsequently heated to a temperature of 80° C. during 30 minutes. Then, the remaining monomer mixture (150.1 g of styrene and 76.5 g of acrylonitrile) was dosed to the reaction mixture during 180 minutes. Simultaneously with the monomer addition, an additional amount of an aqueous persulfate solution was added (37.95 g. of a 2% aqueous $Na_2S_2O_8$ solution). After the monomer addition was completed, the reactor was heated for 60 minutes at 80° C. To reduce the amount of residual monomer a vacuum distillation was performed at 80° C. during 1 hour. The reactor was subsequently cooled to room temperature, 100 ppm Proxel Ultra 5 was added as biocide and the latex was filtered using coarse filter paper.

This resulted in a latex dispersion LX-01 with a solid content of 13.14 wt. % and a pH of 6.10. The average particle size is given in table 3.

The average particle size was 29 nm as measured using PL-PSDA (Polymer Laboratories Particle Size Diameter Analyser). Measured with BI-90 this resulted in a mean particle size of 31 nm.

Preparation of the Printing Plate Precursors PPP-01

The coating composition was prepared by mixing the ingredients as indicated in Table 1. The pH of the coating composition was adjusted to 4.1 with a diluted ammonia solution (ca. 3 wt. %). The resulting solution was coated on the aluminum substrate AS-01 with a coating knife at a wet thickness of 30 μm. After drying for 1 minute at 50° C. in a hot air oven, the printing plate precursor PPP-01 was obtained having a dry coating weight of the different components as given in Table 1.

TABLE 1

Composition of the printing plate precursor PPP-01.

| INGREDIENTS | PPP-01 (dry coating weight of each ingredient) |
|---|---|
| LX-01 (1) | 0.3993 |
| IR-dye 01 (2) | 0.0653 |
| Pigment (3) | 0.0200 |
| Dye (4) | 0.0090 |
| Binder (5) | 0.0261 |
| HEDP (6) | 0.0150 |
| Surfactant (7) | 0.0050 |
| Total dry coating weight of all ingredients (g/m²) | 0.5398 |

(1) LX-01 represents the dispersion of thermoplastic polymer particles as prepared above;
(2) IR-01 represents a 1 wt. % solution in water/ethanol (1/1) of the infrared dye having the following chemical structure:

(3) Pigment represents an aqueous blue pigment dispersion from Cabot Corporation containing 5 wt. % of the modified Cu phthalocyanine pigment IJX883;
(4) Dye represents an aqueous solution (ethanol/water 50/50) containing 1.0 wt. % of the following dye:

(5) Binder represents an aqueous solution containing 1.5 wt. % Aqualic AS58 from Nippon Shokubai;
(6) HEDP represents an aqueous solution containing 6 wt. % 1-hydroxyethylidene-1,1-diphosphonic acid from Solutia;
(7) Surfactant represents an aqueous solution containing 5 wt. % of the fluorinated surfactant Zonyl FS0100 from Dupont.

Processing

In INVENTION EXAMPLE 1, 1250 m² of unexposed precursor PPP-01 was developed in the processor P-1 wherein the plates were firstly processed with 4.2 l of solution Gum-01, present in a first developing bath, and, consecutively, with 6.0 l of solution Gum-01 present in the second developing bath. The two developing baths of the processor P-1 were connected with each other in a cascade system wherein the second gum solution overflowed into the first developing bath, and this first bath was connected with a tank wherein the excess of used gum solution overflowed to be treated as waste. The second gum solution was regenerated by adding the same Gum-01 solution at a rate of 20 ml/m² processed plate precursor. Each of the first and second bath were provided with a pump and a set of pipes to circulate respectively each of the first and second gum solutions and to conduct each of the first and second gum-solution onto a spray-bar. This spray-bar is provided with nozzles and present over total width of the processor to wet the coated side of the precursor. The processing width of the processor has a value of 0.95 m. Above each of the first and second developing bath, beside the spray-bar, two brush rollers were present to brush the coating side of the precursor to enhance the processing of the plates. The temperature of the gum solutions was maintained at 22° C. and the development speed amounted to 1.2 m/min. During processing, the soluble parts of the coating were removed from the support and the concentration of this material cumulated in the first developing solution was determined each time after processing of 50 m² precursor. Due to the presence of blue coloured components in the removed coating layer, the concentration of these components was determined by measuring the absorption of the optical spectrum at 750 nm wavelength and this absorption is also a good measure for the total concentration of removed material. This is shown by curve 1 in FIG. 1 wherein the absorption values were indicated in relation with the number of square maters processed precursor.

In COMPARATIVE EXAMPLE 1, this processing experiment as described above for Invention Example 1 was repeated with processor P-2 which had the same configuration as P-1, but with the exception that 40 l of Gum-01 was provided in the first bath instead of 4.2 l. The results are given by curve 2 in FIG. 1.

Gum-01 is a Solution Prepared as Follow:
To 750 g demineralised water
16 l of Dowfax 3B2, commercially available from Dow Chemical,
0.73 ml of Marlon A365, a mixture of alkylated sodium benzenesulphonic acids from SASOL Germany GmbH contains 65 wt. % solids,
9.8 ml of a 50 wt. % solution of KOH,
38 g Tackidex, a dextrine, commercially available from Roquette frères SA,
27.2 g KH$_2$PO$_4$,
4.85 ml of Proxel Ultra 5DD, a biocide, commercially available from Avecia, and
0.5 ml of Zonyl FSP, an antifoam, commercially available from Dupont,
were added under stirring and demineralised water was further added to 1000 g. The solution has a pH of 7.0 (+/−0.2) and a viscosity of 1.5 (+/−0.12) mP·s.

Figure 1:
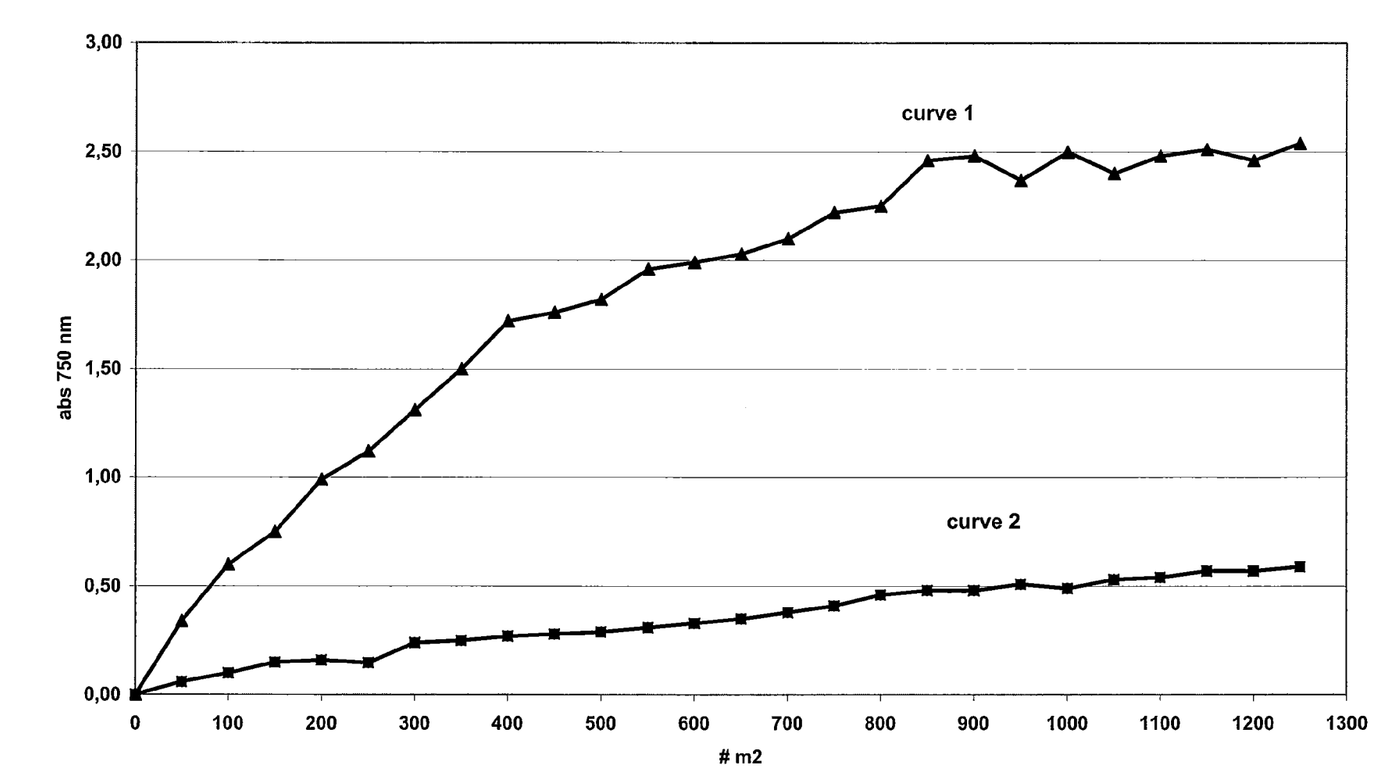
FIG. 1 shows the evolution of the absorption of the first solution at 750 nm in relation to the number of square meters of processed plate precursor.

The results of Invention Example 1 as shown in FIG. 1 demonstrate that, after processing of about 900 m² printing plate precursor, the developing solution reaches a constant value for the absorption at 750 nm, meaning that also a constant level of concentration of removed material in the solution is reached, resulting in a constant level of activity of the developing solution. On the contrary, the Comparative Example 1 demonstrates that, even after processing of 1250 m² printing plate precursor, the concentration of removed material in the solution is still increasing and no constant level of activity of the developing solution is reached.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A method of making a lithographic printing plate, the method comprising the steps of:
- image-wise exposing a lithographic printing plate precursor including a light or heat sensitive coating on a support having a hydrophilic surface or which is provided with a hydrophilic layer; and
- processing the precursor consecutively with a first solution and a second solution so as to remove the coating from the support at non-printing areas; wherein
- the first and second solutions are provided by a cascade system such that the second solution overflows into the first solution and the first solution overflows into a container to be treated as waste;
- the second solution is regenerated by adding a replenishing solution or a mixture of replenishing solutions at a rate of at least 5 ml/m² of treated precursor and at most 30 ml/m² of treated precursor;
- the first and second solutions are circulated, respectively, by a first and a second liquid conveying system;
- the first solution present in the first liquid conveying system has a volume of at least Vmin and at most Vmax, respectively, defined by formula 1 and formula 2:

$$V\text{min}=[A+(\text{processing width}/0.95 \text{ m})]\cdot\text{liter} \quad \text{(formula 1)}$$

$$V\text{max}=[B+(\text{processing width}/0.95 \text{ m})]\cdot\text{liter} \quad \text{(formula 2)}$$

Vmin and Vmax represent, respectively, a minimum and a maximum volume present in the first liquid conveying system expressed in liters;

A and B represent a constant value, and A is 2 and B is 15, 10, 8, or 6; and the processing width represents a width, expressed in m, inside a processing unit, perpendicular to a processing direction of the precursor, which is available for processing plate precursors in a uniform way across their width.

2. The method according to claim 1, wherein the second solution is regenerated by adding a replenishing solution or a mixture of replenishing solutions at a rate of at least 10 ml/m² of treated precursor and at most 25 ml/m² of treated precursor.

3. The method according to claim 1, wherein the second solution is regenerated by adding a replenishing solution or a mixture of replenishing solutions at a rate of at least 15 ml/m² of treated precursor and at most 20 ml/m² of treated precursor.

4. The method according to claim 1, wherein the second solution present in the second liquid conveying system has a volume of at least Vmin and at most Vmax, respectively, defined by formula 3 and formula 4:

$$V\text{min}=[A'+(\text{processing width}/0.95 \text{ m})]\cdot\text{liter} \quad \text{(formula 3)}$$

$$V\text{max}=[B'+(\text{processing width}/0.95 \text{ m})]\cdot\text{liter} \quad \text{(formula 4)}$$

Vmin and Vmax represent, respectively, a minimum and a maximum volume present in the second liquid conveying system expressed in liters;

A' and B' represent a constant value of, respectively, 2 and 15; and the processing width represents the width, expressed in m, inside the processing unit, perpendicular to the processing direction, which is available for processing plate precursors in a uniform way across their width.

5. The method according to claim 1, wherein the volume of the second solution present in the second liquid conveying system is the same as the volume of the first solution present in the first liquid conveying system.

6. The method according to claim 1, wherein the first solution is regenerated by adding a replenishing solution or a mixture of replenishing solutions or water.

7. The method according to claim 1, wherein the coating on the support is a negative-working, light or heat sensitive coating.

8. The method according to claim 1, wherein the coating on the support is negative-working and heat sensitive, and includes thermoplastic polymer particles that coalesce under the influence of infrared radiation or heat.

9. The method according to claim 8, wherein the first and second solutions are both the same and are a gum solution such that the precursor is developed and gummed in one single step.

10. The method according to claim 9, wherein the second solution is regenerated by adding fresh gum solution.

11. The method according to claim 10, wherein the first solution is regenerated by adding water.

* * * * *